US010608149B2

(12) United States Patent
Aoyagi et al.

(10) Patent No.: US 10,608,149 B2
(45) Date of Patent: Mar. 31, 2020

(54) WAVELENGTH CONVERTING MEMBER AND LIGHT EMITTING DEVICE

(71) Applicant: NICHIA CORPORATION, Anan-shi, Tokushima (JP)

(72) Inventors: Kenichi Aoyagi, Tokushima (JP); Takashi Kaide, Anan (JP); Takuya Nakabayashi, Tokushima (JP); Tetsuya Ishikawa, Komatsushima (JP); Shoji Hosokawa, Tokushima (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 16/369,046

(22) Filed: Mar. 29, 2019

(65) Prior Publication Data
US 2019/0305193 A1 Oct. 3, 2019

(30) Foreign Application Priority Data

Mar. 30, 2018 (JP) .................................. 2018-069611
Mar. 25, 2019 (JP) .................................. 2019-057122

(51) Int. Cl.
*H01L 33/50* (2010.01)
*C09K 11/77* (2006.01)
*C09K 11/08* (2006.01)

(52) U.S. Cl.
CPC ........ *H01L 33/504* (2013.01); *C09K 11/0838* (2013.01); *C09K 11/0883* (2013.01); *C09K 11/7734* (2013.01)

(58) Field of Classification Search
CPC .............. H01L 33/504; C09K 11/0883; C09K 11/7734; C09K 11/0838
See application file for complete search history.

(56) References Cited

U.S. PATENT DOCUMENTS 10,096,751 B2   10/2018  Ikeda et al.
2006/0208262 A1* 9/2006  Sakuma ................ C04B 35/597
                                                        257/79

(Continued)

FOREIGN PATENT DOCUMENTS

JP   2007-332324 A   12/2007
JP   2017-188592 A   10/2017

*Primary Examiner* — Donald L Raleigh
(74) *Attorney, Agent, or Firm* — Hunton Andrews Kurth LLP

(57) ABSTRACT

A wavelength converting member comprising a first wavelength converting layer containing: a first fluorescent material having a light emission peak wavelength in a range of 620 nm or more and 660 nm or less; a second fluorescent material having a light emission peak wavelength in a range of 510 nm or more and 560 nm or less; and a resin, wherein the average particle diameter, as measured according to a Fisher Sub-Sieve Sizer method, of the first fluorescent material is in a range of 2 μm or more and 30 μm or less, wherein the second fluorescent material comprises a β-SiAlON fluorescent material, the circularity of the β-SiAlON fluorescent material is 0.7 or more, and the volume average particle diameter, as measured according to a laser diffraction scattering particle size distribution measuring method, of the β-SiAlON fluorescent material is in a range of 2 μm or more and 30 μm or less, and wherein the thickness of the first wavelength converting layer is in a range of 50 μm or more and 200 μm or less.

15 Claims, 10 Drawing Sheets

(56) References Cited

U.S. PATENT DOCUMENTS

| | | | |
|---|---|---|---|
| 2008/0210961 A1* | 9/2008 | Lin | H01L 33/508 257/98 |
| 2009/0261366 A1* | 10/2009 | Eisert | H01L 33/46 257/98 |
| 2010/0237767 A1* | 9/2010 | Emoto | C04B 35/597 313/503 |
| 2016/0276549 A1* | 9/2016 | Yamashita | H05B 37/02 |
| 2017/0077360 A1* | 3/2017 | Yang | C09K 11/0883 |
| 2017/0250320 A1* | 8/2017 | Wakui | C09K 11/0883 |
| 2017/0294561 A1 | 10/2017 | Ikeda et al. | |
| 2018/0033922 A1* | 2/2018 | Iwakura | H01L 33/46 |
| 2018/0190871 A1* | 7/2018 | Kim | H01L 33/36 |
| 2019/0035984 A1 | 1/2019 | Ikeda et al. | |
| 2019/0088832 A1* | 3/2019 | Onuma | F21S 2/00 |

* cited by examiner

WAVELENGTH CONVERTING MEMBER AND LIGHT EMITTING DEVICE

CROSS-REFERENCE TO RELATED PATENT APPLICATION

This application claims priority to Japanese Patent Application No. 2018-069611, filed on Mar. 30, 2018, and Japanese Patent Application No. 2019-057122, filed on Mar. 25, 2019, the entire disclosures of which are incorporated herein by references in their entirety.

BACKGROUND

Technical Field

The present invention relates to a wavelength converting member that convers the wavelength of light emitted from a light emitting diode (hereinafter also referred to as "LED") or a laser diode (hereinafter also referred to as "LD"), and a light emitting device using the same.

Description of Related Art

A light emitting device containing an LED or an LD in combination with a fluorescent material has been used for lighting systems, backlights for liquid crystal display devices, and in-car lights, and demands for thinning the light emitting device have been increased. In this specification, the "fluorescent material" is used in the same meaning as a "fluorescent phosphor".

As the light emitting device, for example, Japanese Unexamined Patent Publication No. 2017-188592 discloses a light emitting device using an LED as a light emitting element, in which a wavelength converting member formed of a sheet-shaped composition containing a fluorescent material and a resin is arranged in front of the light emitting element. With such demands for thinning the light emitting device, thinning of the wavelength converting member formed in a sheet shape has been also required.

However, in the thinned wavelength converting member, the color tone deviation readily occurs on each wavelength converting member due to an influence of the deviation of the particle shape of the contained specific fluorescent material or the distribution state thereof. Further, in the light emitting device using such a wavelength converting member, the light emitting device of which the color tone is largely deviated from a desired color tone is readily present among mass-produced light emitting devices, and thus the production yield of the light emitting device tends to be lower.

Accordingly, an embodiment of the present disclosure has an object to provide a wavelength converting member capable of providing a desired color tone and improving the production yield, and a light emitting device using the same.

SUMMARY

Measures for solving the aforementioned problems are as follows. The present disclosure includes the following embodiments.

A first embodiment of the present disclosure relates to a wavelength converting member comprising a first wavelength converting layer containing: a first fluorescent material having a light emission peak wavelength in a range of 620 nm or more and 660 nm or less; a second fluorescent material having a light emission peak wavelength in a range of 510 nm or more and 560 nm or less; and a resin, wherein the average particle diameter, as measured according to a Fisher Sub-Sieve Sizer method, of the first fluorescent material is in a range of 2 μm or more and 30 μm or less, wherein the second fluorescent material comprises a β-SiAlON fluorescent material, the circularity of the β-SiAlON fluorescent material is 0.7 or more, and the volume average particle diameter, as measured according to a laser diffraction scattering particle size distribution measuring method, of the β-SiAlON fluorescent material is in a range of 2 μm or more and 30 μm or less, and wherein the thickness of the first wavelength converting layer is in a range of 50 μm or more and 200 μm or less.

A second embodiment of the present disclosure relates to a wavelength converting member comprising: a second wavelength converting layer containing a first fluorescent material having a light emission peak wavelength in a range of 620 nm or more and 660 nm or less and a resin; and a third wavelength converting layer containing a second fluorescent material having a light emission peak wavelength in a range of 510 nm or more and 560 nm or less and a resin, wherein the average particle diameter, as measured according to the Fisher Sub-Sieve Sizer method, of the first fluorescent material is in a range of 2 μm or more and 30 μm or less, wherein the second fluorescent material comprises a β-SiAlON fluorescent material, the circularity of the β-SiAlON fluorescent material is 0.7 or more, and the volume average particle diameter, as measured according to the laser diffraction scattering particle size distribution measuring method, of the β-SiAlON fluorescent material is in a range of 2 μm or more and 30 μm or less, and wherein the thickness of each of the second wavelength converting layer and the third wavelength converting layer is in a range of 10 μm or more and 150 μm or less.

A third embodiment of the present disclosure relates to a light emitting device comprising a wavelength converting member according to the present disclosure and a light emitting element having a light emission peak wavelength in a range of 400 nm or more and 480 nm or less.

In accordance with the wavelength converting member and the light emitting device of the present, light having a desired color tone can be obtained, and the production yield can be improved.

DETAILED DESCRIPTION

Embodiments of the wavelength converting member and the light emitting device according to the present disclosure are hereunder described. The embodiments shown below are exemplifications for exemplifying the technical idea of the present invention, and the present invention is not limited to the wavelength converting member and the light emitting device mentioned below. Standards according to JIS Z8110 are applied to the relations between color names and chromaticity coordinates, the relations between wavelength ranges of light and color names of monochromatic lights.

Wavelength Converting Member

The wavelength converting member is a wavelength converting member comprising a first wavelength converting layer containing: a first fluorescent material having a light emission peak wavelength in a range of 620 nm or more and 660 nm or less; a second fluorescent material having a light emission peak wavelength in a range of 510 nm or more and 560 nm or less; and a resin, wherein the average particle diameter, as measured according to the Fisher Sub-Sieve Sizer method (hereinafter also referred to as "FSSS method"), of the first fluorescent material is in a range of 2 μm or more and 30 μm or less, wherein the second fluorescent material comprises a β-SiAlON fluorescent material, the circularity of the β-SiAlON fluorescent material is 0.7 or more, and the volume average particle diameter, as measured according to the laser diffraction scattering particle size distribution measuring method, of the β-SiAlON fluorescent material is in a range of 2 μm or more and 30 μm or less, and wherein the thickness of the first wavelength converting layer is in a range of 50 μm or more and 200 μm or less.

The FSSS method is a method of measuring a specific surface area by utilizing the flow resistance of air according to an air permeability method to determine a particle diameter. The average particle diameter, as measured according to the FSSS method, of particles is also referred to as a Fisher Sub-Sieve Sizer's number. The laser diffraction scattering particle size distribution measuring method is a method of measuring a particle diameter irrespective of primary particles and secondary particles by utilizing the scattered light from the laser light radiated to particles. The volume average particle diameter means an average particle diameter (median diameter: Dm) where the volume cumulative frequency from the small diameter side reaches 50% in the volume-based particle size distribution, as measured according to the laser diffraction scattering particle size distribution measuring method.

Figure 1:
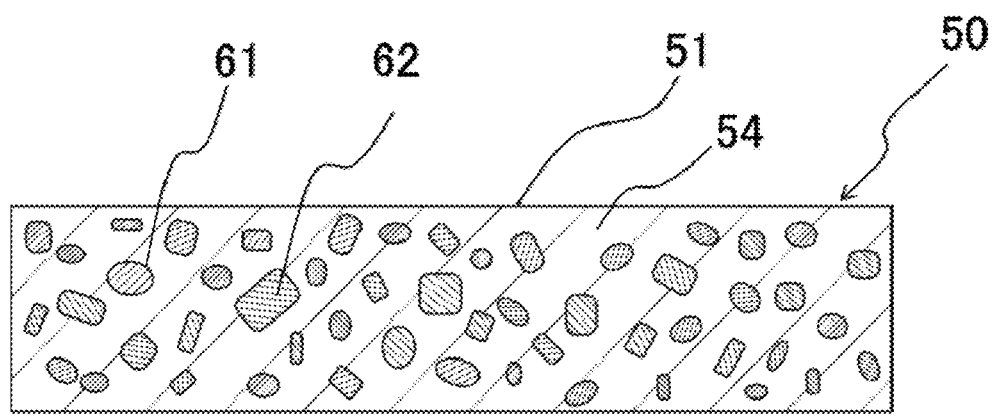
FIG. 1 is a schematic cross-sectional view showing one example of a first wavelength converting layer contained in a wavelength converting member according to the present disclosure.

FIG. 1 is a schematic cross-sectional view showing one example of a wavelength converting member 50. As shown in FIG. 1, the wavelength converting member 50 contains a first wavelength converting layer 51. The first wavelength converting layer 51 contains two kinds of fluorescent materials, including a first fluorescent material 61 and a second fluorescent material 62. The first wavelength converting layer 51 converts excitation light emitted from a light emitting element to light having a different wavelength by the first fluorescent material 61 and the second fluorescent material 62, so that mixed-color light having a desired color tone can be provided. The first wavelength converting layer 51 contains the first fluorescent material 61, the second fluorescent material 62, and a resin 54. The thickness of the first wavelength converting layer 51 is in a range of 50 μm or more and 200 μm or less, and preferably in a range of 60 μm or more and 195 μm or less, more preferably in a range of 70 μm or more and 190 μm or less, even more preferably in a range of 80 μm or more and 185 μm or less. When the thickness of the first wavelength converting layer 51 is more than 200 μm, and when using for a light emitting device, demands for thinning the light emitting device may not be satisfied. When the thickness of the first wavelength converting layer 51 is less than 50 μm, the total amount of the first fluorescent material 61 and the second fluorescent material 62 contained in the first wavelength converting layer 51 becomes small. Thus, the excitation light passes the wavelength converting member without being wavelength-converted by the fluorescent materials, resulting in that a desired color tone may not be provided.

The wavelength converting member according to an embodiment of the present disclosure may be a wavelength converting member comprising: a second wavelength converting layer containing a first fluorescent material having a light emission peak wavelength in a range of 620 nm or more and 660 nm or less and a first resin; and a third wavelength converting layer containing a second fluorescent material having a light emission peak wavelength in a range of 510 nm or more and 560 nm or less and a second resin, wherein the average particle diameter, as measured according to the Fisher Sub-Sieve Sizer method, of the first fluorescent material is in a range of 2 μm or more and 30 μm or less, wherein the second fluorescent material comprises a β-SiAlON fluorescent material, the circularity of the β-SiAlON fluorescent material is 0.7 or more, and the volume average particle diameter, as measured according to the laser diffraction scattering particle size distribution measuring method, of the β-SiAlON fluorescent material is in a range of 2 μm or more and 30 μm or less, and wherein the thickness of each of the second wavelength converting layer and the third wavelength converting layer is in a range of 10 μm or more and 150 μm or less.

Figure 2:
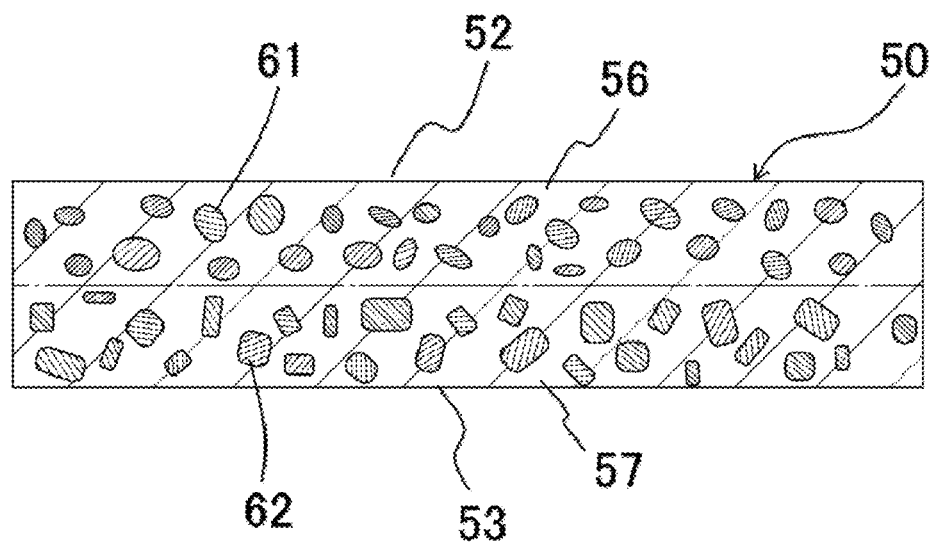
FIG. 2 is a schematic cross-sectional view showing one example of a second wavelength converting layer and a third wavelength converting layer each contained in a wavelength converting member according to the present disclosure.

FIG. 2 is a schematic cross-sectional view showing one example of a wavelength converting member 50. As shown in FIG. 2, the wavelength converting member 50 contains a second wavelength converting layer 52 and a third wavelength converting layer 53. The second wavelength converting layer 52 contains the first fluorescent material 61 and a first resin 56, and substantially does not contain a second fluorescent material. Here, the phrase "substantially does not contain a second fluorescent material" refers to a state where almost no second fluorescent material exists in the second wavelength converting layer 52, and although it is not limited, the amount of the second fluorescent material is 1% by mass or less relative to the total amount of the second wavelength converting layer 52. The third wavelength converting layer 53 contains the second fluorescent material 62 and a second resin 57, and substantially does not contain a first fluorescent material. Here, the phrase "substantially does not contain a first fluorescent material" refers to a state where almost no first fluorescent material exists in the third wavelength converting layer 53, and although it is not limited, the amount of the first fluorescent material is 1% by mass or less relative to the total amount of the third wavelength converting layer 53. When the wavelength converting member 50 contains the second wavelength converting layer 52 containing the first fluorescent material 61 and the third wavelength converting layer 53 containing the second fluorescent material 62, mixed-color light having a desired color tone, formed by converting the wavelength of the excitation light emitted from the light emitting element by the second wavelength converting layer 52 and the third wavelength converting layer 53, can be provided. Further, since the type of the fluorescent materials contained in the second wavelength converting layer 52 and the third wavelength converting layer 53 is different, the laminating order of the second wavelength converting layer 52 and the third wavelength converting layer 53 can be changed depending on the characteristics of the fluorescent material contained in the wavelength converting layer by considering an environmental atmosphere such as heat generated from the light emitting element, humidity, or temperature, and a light emitting device capable of providing a desired color tone and suppressing deterioration of the fluorescent material can be obtained.

The thickness of each of the second wavelength converting layer 52 and the third wavelength converting layer 53 is in a range of 10 μm or more and 150 μm or less, and preferably in a range of 15 μm or more and 140 μm or less, more preferably in a range of 20 μm or more and 130 μm or less, even more preferably in a range of 25 μm or more and 120 μm or less. When the thickness of each of the second wavelength converting layer 52 and the third wavelength converting layer 53 is more than 150 μm, the thickness of layer formed by laminating the two wavelength converting layers becomes more than 200 μm, and when using for a light emitting device, demands for thinning the light emitting device may not be satisfied. When the thickness of each of the second wavelength converting layer 52 and the third wavelength converting layer 53 is less than 10 μm, the amount of each of the first fluorescent material 61 contained in the second wavelength converting layer 52 and the second fluorescent material 62 contained in the third wavelength converting layer 53 becomes small. Thus, the excitation light passes the wavelength converting member without being wavelength-converted by the first fluorescent material or the second fluorescent material, or the wavelength of the excitation light is not sufficiently wavelength-converted by the first fluorescent material or the second fluorescent material, resulting in that a desired color tone may not be provided.

Second Fluorescent Material

The second fluorescent material having a light emission peak wavelength in a range of 510 nm or more and 560 nm or less contains a β-SiAlON fluorescent material, the circularity of the β-SiAlON fluorescent material is 0.7 or more, and the volume average particle diameter, as measured according to the laser diffraction scattering particle size distribution measuring method, of the β-SiAlON fluorescent material is in a range of 2 μm or more and 30 μm or less.

β-SiAlON Fluorescent Material

The β-SiAlON fluorescent material is a solid solution in which a part of silicon and nitride each contained in silicon nitride is replaced with aluminum and oxygen. The β-SiAlON fluorescent material belongs to a hexagonal crystal system, and has a crystal structure in which layers formed of a tetrahedral framework of $Al(O, N)_4$ are laminated in the c-axis direction. Since the β-SiAlON fluorescent material has a hexagonal crystal structure, the particles of the β-SiAlON fluorescent material tend to largely contain particles having an anisotropic shape such as a needle shape, a columnar shape, a cylindrical shape, a plate shape, or a sheet shape. When the particle shape of the β-SiAlON fluorescent material is an anisotropic shape, and when constituting a light emitting device, the arrangement state of the β-SiAlON fluorescent material with respect to the light emitting element varies for each fluorescent material, and the locations where the anisotropic-shaped fluorescent material is irradiated with light emitted from the light emitting element are different. Accordingly, the color tones may be different for each fluorescent material and even for each light emitting device. In particular, when the β-SiAlON fluorescent material is contained in a relatively thin sheet-shaped wavelength converting member and the sheet-shaped wavelength converting member is arranged in front of the light emitting element, almost all of the light emitted from the light emitting element is entered into the sheet-shaped wavelength converting member in a vertical direction, and the distance reaching the fluorescent material contained in the sheet-shaped wavelength converting member becomes short. Thus, the anisotropic-shaped fluorescent material is easy to be uniformly irradiated with the light emitted from the light emitting element. When the β-SiAlON fluorescent material is arranged in various states such as a horizontal state, a vertical state, and an oblique state with respect to the incident direction of the light, the light emitted from the light emitting element is entered from various surface directions of the β-SiAlON fluorescent material, the degree of wavelength conversion by the fluorescent material varies depending on the locations where the particles of the fluorescent material are irradiated with the light, and the color tone tends to largely vary for each wavelength converting member.

The wavelength converting member contains the β-SiAlON fluorescent material as a second fluorescent material contained in the sheet-shaped wavelength converting member. When the circularity of the β-SiAlON fluorescent material is 0.7 or more and the volume average particle diameter thereof, as measured according to the laser diffraction scattering particle size distribution measuring method, is in a range of 2 μm or more and 30 μm or less, the change in chromaticity caused by the deviation of location where the fluorescent material is irradiated with the light emitted from the light emitting element is suppressed, so that the color tone deviation for each light emitting device can be suppressed.

The circularity of the β-SiAlON fluorescent material is 0.7 or more. It indicates that the closer the circularity is 1.0, the more similar the shape is a circular shape. The circularity can be determined by: randomly selecting a particle from the photographed image by the observation using a scanning electron microscope (SEM), a transmission electron microscope (TEM), or an optical microscope; measuring a projected area (S ($m^2$)) and a peripheral length (L (m)) of the particle using an image processing software or the like; and calculating according to the following formula (1). The circularity can be determined as an average value of the group having an arbitrary number of particles, and is preferably determined as an average value of 100 or more particles. In the present specification, the circularity refers to an average value of the circularities of 5,000 β-SiAlON fluorescent material particles that are randomly selected.

$$\text{Circularity} = 4\pi S/L^2 \quad (1)$$

The circularity of the β-SiAlON fluorescent material that is used for the wavelength converting member is 0.7 or more, and preferably 0.71 or more, more preferably 0.72 or more, even more preferably 0.74 or more, still more preferably 0.75 or more, particularly preferably 0.80 or more and 1.0 or less. When the circularity of the β-SiAlON fluorescent material contained in the wavelength converting member is 0.7 or more, and when containing the nearly circular β-SiAlON fluorescent material, the light emitted from the light emitting element is entered from a substantially uniform surface direction with respect to the β-SiAlON fluorescent material, and the change in chromaticity caused by entering the excitation light from various surface directions is suppressed, so that a wavelength converting member capable of providing a desired color tone can be obtained. Further, when the circularity is 0.7 or more, the β-SiAlON fluorescent material contained in the wavelength converting member is easy to be uniformly dispersed in the resin. In the case of producing a light emitting device, when the wavelength converting member containing the fluorescent material having an anisotropic shape such as a cylindrical shape or a plate shape is cut into a sheet shape, a relatively hard fluorescent material is hardly cut, and thus the fluorescent material may stick out to the outside from the end surface of the cut wavelength converting member. Also, when cutting a relatively hard fluorescent material, strain may be generated on the sheet-shaped wavelength converting member. When the circularity of the β-SiAlON fluorescent material contained in the wavelength converting member is 0.7 or more, inconvenient behaviors in the production, such as sticking out of the fluorescent material to the outside from the end surface of the cut wavelength converting member and strain generated on the wavelength converting member, can be improved.

The volume average particle diameter (hereinafter also referred to as "volume average particle diameter Dm2"), as measured according to the laser diffraction scattering particle size distribution measuring method, of the β-SiAlON fluorescent material is in a range of 2 μm or more and 30 μm or less, and preferably in a range of 3 μm or more and 28 μm or less, more preferably in a range of 5 μm or more and 25 μm or less, even more preferably in a range of 6 μm or more and 20 μm or less. When the volume average particle diameter of the β-SiAlON fluorescent material is more than 30 μm, and when the β-SiAlON fluorescent material is contained in the sheet-shaped wavelength converting member, it may be hard to thin the thickness of the sheet due to too large volume average particle diameter. Further, when the volume average particle diameter of the β-SiAlON fluorescent material is more than 30 μm, it is hard for the fluorescent material to be uniformly arranged to the surface of the sheet-shaped wavelength converting member, and the light emitted from the light emitting element is not irradiated on the fluorescent material to thereby pass through the wavelength converting member. Thus, the chromaticity is changed, and a desired color tone may not be obtained. When the volume average particle diameter of the β-SiAlON fluorescent material is less than 2 μm, the light emitted from the light emitting element may not be efficiently wavelength-converted.

The aspect ratio of the β-SiAlON fluorescent material is preferably 0.62 or more, and the ratio (D2/Dm2) (hereinafter also referred to as "particle diameter ratio D2/Dm2") of the average particle diameter (hereinafter also referred to as "average particle diameter D2"), as measured according to the FSSS method, to the volume average particle diameter Dm2, as measured according to the laser diffraction scattering particle size distribution measuring method, is preferably 0.67 or more. The aspect ratio of the β-SiAlON fluorescent material is more preferably 0.64 or more, even more preferably 0.66 or more, still more preferably 0.68 or more. The aspect ratio of the β-SiAlON fluorescent material is generally 1.0 or less. It indicates that the smaller the value of the aspect ratio is, the more similar the shape is an anisotropic shape such as a cylindrical shape or a plate shape, and the closer the aspect ratio is 1, the more similar the shape is an isotropic shape such as a circular shape or a polygonal shape. When the aspect ratio of the β-SiAlON fluorescent material is 0.62 or more, and when the SiAlON fluorescent material having a shape similar to an isotropic shape is contained in the wavelength converting member, the light emitted from the light emitting element is entered from a substantially uniform surface direction with respect to the β-SiAlON fluorescent material, and the change in chromaticity caused by entering the excitation light from various surface directions is suppressed, so that a wavelength converting member capable of providing a desired color tone can be obtained. Further, when the aspect ratio is 0.62 or more, the β-SiAlON fluorescent material contained in the wavelength converting member is easy to be uniformly dispersed in the resin. In the case of producing a light emitting device, when the aspect ratio of the β-SiAlON fluorescent material contained in the wavelength converting member is 0.62 or more and the β-SiAlON fluorescent material has a shape similar to an isotropic shape, inconvenient behaviors in the production, such as sticking out of the fluorescent material to the outside from the end surface of the cut wavelength converting member and strain generated on the wavelength converting member, can be improved. The aspect ratio of the β-SiAlON fluorescent material can be determined by: randomly selecting a particle from the photographed image by the observation using a scanning electron microscope (SEM), a transmission electron microscope (TEM), or an optical microscope; measuring a long diameter and a short diameter of the particle; and calculating a ratio (short diameter/long diameter) of the short diameter to the long diameter as the aspect ratio. The aspect ratio is preferably determined as an average value of 100 or more particles. In the present specification, the aspect ratio refers to an average value of the aspect ratios of 5,000 β-SiAlON fluorescent material particles that are randomly selected.

The particle diameter ratio D2/Dm2, which is the ratio of the average particle diameter D2, as measured according to the FSSS method, to the volume average particle diameter Dm2, as measured according to the laser diffraction scattering particle size distribution measuring method, of the β-SiAlON fluorescent material is preferably 0.67 or more. The particle diameter ratio D2/Dm2 of the β-SiAlON fluorescent material is more preferably 0.68 or more, even more preferably 0.70 or more, still more preferably 0.72 or more, particularly preferably 0.75 or more, and generally 1.0 or less. The particle diameter ratio D2/Dm2 indicates a ratio of the average particle diameter D2 of primary particles to the average particle diameter D2 of particles as measured irrespective of primary particles and secondary particles, and when the value of the particle diameter ratio D2/Dm2 is closer to 1, the ratio of the primary particles present in the particles is larger. When the aspect ratio of the β-SiAlON fluorescent material contained in the wavelength converting member is 0.62 or more and the particle diameter ratio D2/Dm2 thereof is 0.67 or more, and when the β-SiAlON fluorescent material as primary particles having a shape similar to an isotropic shape is contained in the wavelength converting member, the β-SiAlON fluorescent material is well dispersed in the resin, the β-SiAlON fluorescent material is uniformly arranged in the wavelength converting member, the light emitted from the light emitting element is entered from a substantially uniform surface direction with respect to the β-SiAlON fluorescent material, and the change in chromaticity caused by entering the excitation light from various surface directions is suppressed, so that a wavelength converting member capable of providing a desired color tone can be obtained. In the case of producing a light emitting device, when the β-SiAlON fluorescent material contained in the wavelength converting member has a shape similar to an isotropic shape and is uniformly dispersed in the resin to be arranged therein, inconvenient behaviors in the production, such as sticking out of the fluorescent material to the outside from the end surface of the cut wavelength converting member and strain generated on the wavelength converting member, can be improved.

The β-SiAlON fluorescent material preferably contains a composition represented by the following formula (I).

$$Si_{6-z}Al_zO_zN_{8-z}:Eu \qquad (I)$$

wherein z satisfies 0<z≤4.2, and wherein the part before the column (:) in the formula representing the composition of the fluorescent material expresses elements constituting of a host crystal and a molar ratio the elements, and the part after the column (:) expresses an activating element (the same applies to the following formulae that represent a composition of the fluorescent material). The term 'molar ratio' refers to the molar amount of an element in one mole of the chemical composition of the fluorescent material.

As for the β-SiAlON fluorescent material, by adjusting the heat treatment temperature and the heat treatment atmosphere of the heat-treated product obtained by subjecting the mixture, in which the raw materials constituting the β-SiAlON fluorescent material are mixed, to the heat treatment, and adjusting the grinding conditions of the resultant heat-treated product, a β-SiAlON fluorescent material having a desired circularity and volume average particle diameter Dm2 can be produced. For example, a β-SiAlON fluorescent material having a circularity of 0.7 or more and a volume average particle diameter Dm2 in a range of 2 μm or more and 30 μm or less can be produced according to the method described in Japanese Patent Application No. 2017-97125. Also, a β-SiAlON fluorescent material, in which the aspect ratio is 0.62 or more and the particle diameter ratio D2/Dm2 of the average particle diameter D2 to the volume average particle diameter Dm2 is 0.67 or more, can be produced according to the aforementioned method.

The second fluorescent material may contain other fluorescent material than the β-SiAlON fluorescent material as long as a desired color tone can be obtained. When the second fluorescent material contains other fluorescent material than the β-SiAlON fluorescent material, the other fluorescent material serving as the second fluorescent material is also a fluorescent material having a light emission peak wavelength in a range of 510 nm or more and 560 nm or less. It is preferable that the second fluorescent material further comprises, for example, a chlorosilicate-based fluorescent material, a Mn$^{2+}$-activated aluminate fluorescent material having a composition containing at least one alkaline earth metal element selected from the group consisting of Ba, Sr, and Ca, and at least one fluorescent material selected from the group consisting of γ-AlON fluorescent materials. The volume average particle diameter, as measured according to the laser diffraction scattering particle size distribution measuring method, of the other fluorescent material than the β-SiAlON fluorescent material that is contained in the second fluorescent material is preferably in a range of 2 μm or more and 30 μm or less. When the volume average particle diameter of the other fluorescent material than the β-SiAlON fluorescent material that is contained in the second fluorescent material falls within the aforementioned range, the thickness of the sheet-shaped wavelength converting member can be thinned, and even in the case of thinning the thickness, the change in chromaticity is suppressed by uniformly arranging the second fluorescent material in the sheet-shaped wavelength converting member, so that a wavelength converting member capable of providing a desired color tone can be obtained.

The chlorosilicate fluorescent material preferably contains a composition represented by the following formula (II).

$$M^1{}_8MgSi_4O_{16}X^1{}_2:Eu \qquad (II)$$

wherein M$^1$ represents at least one selected from the group consisting of Ca, Sr, Ba, and Zn, and X$^1$ represents at least one selected from the group consisting of F, Cl, Br, and I.

The Mn$^{2+}$-activated aluminate fluorescent material having a composition containing at least one alkaline earth metal element selected from the group consisting of Ba, Sr, and Ca preferably contains a composition represented by the following formula (III).

$$M^2{}_aMg_bMn_cAl_dO_{a+b+c+1.5d} \qquad (III)$$

wherein M$^2$ represents at least one alkaline earth metal element selected from the group consisting of Ba, Sr, and Ca, and a, b, c, and d each satisfy 0.5≤a≤1.0, 0≤b<0.4, 0.3≤c≤0.7, 8.5≤d≤13.0, and 9.0≤b+c+d≤14.0.

The γ-AlON fluorescent material is a Mn$^{2+}$-activated aluminum oxynitride fluorescent material containing a spinel-type aluminum oxynitride crystal (γ-AlON) that belongs to a cubic crystal system. The γ-AlON fluorescent material preferably contains a composition represented by the following formula (IV).

$$Mn_eMg_fLi_gAl_hO_iN_j \qquad (IV)$$

wherein e, f, g, h, i, and j each satisfy 0.005≤e≤0.02, 0.01≤f≤0.035, 0.01≤g≤0.04, 0.3≤h≤0.45, 0.4≤i≤0.6, 0.3≤j≤0.6, when e+f+g+h+i+j=1.

It is preferable that the second fluorescent material further contains a fluorescent material containing any of the compositions represented by the formulae (II) to (IV).

First Fluorescent Material

The first fluorescent material having a light emission peak wavelength in a range of 620 nm or more and 660 nm or less has an average particle diameter (hereinafter also referred to as "average particle diameter D1"), as measured according to the FSSS method, in a range of 2 μm or more and 30 μm or less. The average particle diameter D1, as measured according to the FSSS method, of the first fluorescent material is preferably in a range of 3 μm or more and 28 μm or less, more preferably in a range of 5 μm or more and 25 μm or less, even more preferably in a range of 7 μm or more and 22 μm or less, still more preferably in a range of 8 μm or more and 20 μm or less. When the average particle diameter D1 of the first fluorescent material is more than 30 μm, the sheet-shaped wavelength converting member cannot be thinned, and the demands for thinning may not be satisfied. Further, when the average particle diameter D1 of the first fluorescent material is more than 30 μm, it is hard for the first fluorescent material to be uniformly arranged to the surface of the sheet-shaped wavelength converting member, and the light emitted from the light emitting element is not irradiated on the first fluorescent material to thereby pass through the wavelength converting member. Thus, a desired color tone cannot be obtained, and color unevenness may occur. When the average particle diameter D1, as measured according to the FSSS method, of the first fluorescent material is less than 2 μm, the light emitted from the light emitting element may not be efficiently wavelength-converted. The first fluorescent material having an average particle diameter D1 in a range of 2 μm or more and 30 μm or less can be produced by performing treatments such as a crushing treatment, a grinding treatment, and a classification treatment, and adjusting the conditions of the respective treatments.

The kind of the first fluorescent material having a light emission peak wavelength in a range of 620 nm or more and 660 nm or less is not particularly limited as long as a desired color tone can be obtained. The first fluorescent material having a light emission peak wavelength in a range of 620 nm or more and 660 nm or less preferably comprises: a $Mn^{4+}$-activated fluoride fluorescent material; a fluorescent material containing an $Eu^{2+}$-activated silicon nitride having a composition containing at least one element selected from Sr and Ca, and Al; and at least one fluorescent material selected from the group consisting of fluorescent materials containing an $Eu^{2+}$-activated aluminum nitride having a composition containing at least one element selected from the group consisting of alkaline earth metal elements and at least one element selected from the group consisting of alkali metal elements.

The $Mn^{4+}$-activated fluoride fluorescent material preferably contains a composition represented by the following formula (i).

$$A_2[M^3_{1-k}Mn^{4+}_kF_6] \quad (i)$$

wherein A represents at least one selected from the group consisting of K, Li, Na, Rb, Cs, and $NH_4^+$, $M^3$ represents at least one element selected from the group consisting of group 4 elements and group 14 elements, and k satisfies 0<k<0.2.

The fluorescent material containing an $Eu^{2+}$-activated silicon nitride having a composition containing at least one element selected from Sr and Ca, and Al preferably contains a composition represented by the following formula (ii). However, the fluorescent material containing the composition represented by the following formula (ii) may be indicated as a $CaAlSiN_3$:Eu fluorescent material or a (Sr, Ca)$AlSiN_3$:Eu fluorescent material.

$$(Ca_{1-m-n}Sr_mEu_n)_pAl_qSi_rN_s \quad (ii)$$

wherein m, n, p, q, r, and s each satisfy 0≤m≤1, 0<n<1.0, 0<m+n<1.0, 0.8≤p≤1.0, 0.8≤q≤1.2, 0.8≤r≤1.2, 1.9≤q+r≤2.1, and 2.5≤s≤3.5 respectively, wherein a value of m times p represents a molar ratio of Sr in the composition represented by the formula (ii), and preferably satisfies 0≤m≤0.98, more preferably 0≤m≤0.95, even more preferably 0≤m≤0.9, and wherein a value of n times p represents a molar ratio of the activating element Eu in the composition represented by the formula (ii), and preferably satisfies 0.0001≤n≤0.2, more preferably 0.0001≤n≤0.1, even more preferably 0.0002≤n≤0.05.

The fluorescent material containing an $Eu^{2+}$-activated aluminum nitride having a composition containing at least one element selected from the group consisting of alkaline earth metal elements and at least one element selected from the group consisting of alkali metal elements preferably contains a composition represented by the following formula (iii).

$$M^5_tM^6_uM^7_vAl_{3-w}Si_wN_x \quad (iii)$$

wherein $M^5$ represents at least one element selected from the group consisting of Ca, Sr, Ba and Mg, $M^6$ represents at least one element selected from the group consisting of Li, Na, and K, $M^7$ represents at least one element selected from the group consisting of Eu, Ce, Tb and Mn, and t, u, v, w and x each satisfy 0.80≤t≤1.05, 0.80≤u≤1.05, 0.001<v≤0.1, 0≤w≤0.5, and 3.0≤x≤5.0.

The first fluorescent material preferably contains a fluorescent material containing any of the compositions represented by the formulae (i) to (iii).

Resin

Examples of the resin contained in the wavelength converting member may include a silicone resin, an epoxy resin, a phenol resin, a polycarbonate resin, an acrylic resin, and a modified resin of any of these. Among others, a silicone resin or an epoxy resin having excellent heat resistance is preferred, and a silicone resin having excellent heat resistance and light resistance is more preferred. Examples of the silicone resin may include a dimethyl silicone resin, a phenylmethyl silicone resin, and a diphenyl silicone resin. Hereinafter, the "modified resin" in the present specification shall contain a hybrid resin.

The mass ratio of the resin to the total of the first fluorescent material and the second fluorescent material in the first wavelength converting layer is not particularly limited as long as a desired color tone can be obtained by the wavelength converting member and an effect of improving the production yield can be obtained. The mass ratio (resin: total of first fluorescent material and second fluorescent material) of the resin to the total of the first fluorescent material and the second fluorescent material in the first wavelength converting layer is preferably in a range of 100:50 to 100:260, more preferably in a range of 100:55 to 100:255, even more preferably in a range of 100:60 to 100:250, still more preferably in a range of 100:65 to 100:245. When the mass ratio (resin total of first fluorescent material and second fluorescent material) of the resin to the total of the first fluorescent material and the second fluorescent material in the first wavelength converting layer falls within the aforementioned range, a desired color tone can be obtained, and a first wavelength converting layer having a desired thickness can be produced. The mass ratio (first fluorescent material second fluorescent material) of the first fluorescent material to the second fluorescent material in the first wavelength converting layer is changed depending on a desired color tone, but is preferably in a range of 100:10 to 100:70, more preferably in a range of 100:15 to 100:65, even more preferably in a range of 100:20 to 100:60.

As for the first wavelength converting layer, the arrangement relation of the first fluorescent material or the second fluorescent material in the first wavelength converting layer is not particularly limited as long as a desired color tone can be obtained and an effect of improving the production yield can be obtained. For example, the first wavelength converting layer may be formed by arranging the first fluorescent material and the second fluorescent material so as to be mixed with each other in the thickness direction of the first wavelength converting layer. Further, the first wavelength

converting layer may be formed as follows: in the first wavelength converting layer, for example, the second fluorescent material is previously added to a liquid resin; the previously-added second fluorescent material is precipitated so as to be arranged eccentrically to one surface side in a process of curing the resin; then, the first fluorescent material is added and arranged on the second fluorescent material in the thickness direction; and the resin is cured. As for the order of adding the fluorescent materials to the resin for forming the first wavelength converting layer, it does not matter whether the first fluorescent material is first or the second fluorescent material is first. In order to precipitate the fluorescent material, the fluorescent material may be naturally precipitated, or may be forcibly precipitated using a centrifugal separator. The first wavelength converting layer has a first main surface as one of the surfaces and a second main surface that is a surface on a side opposite to the first main surface, and may be formed as follows: one of the first fluorescent material or the second fluorescent material is eccentrically arranged on the first main surface side, and another one of the first fluorescent material or the second fluorescent material is eccentrically arranged on the second main surface side, so as to have an area where the first fluorescent material and the second fluorescent material are mixedly present in the thickness direction of the first wavelength converting layer.

The mass ratio of the resin to the first fluorescent material in the second wavelength converting layer is not particularly limited as long as a desired color tone can be obtained by the wavelength converting member. The mass ratio (resin:first fluorescent material) of the resin to the first fluorescent material in the second wavelength converting layer is preferably in a range of 100:50 to 100:260, more preferably in a range of 100:55 to 100:255, even more preferably in a range of 100:60 to 100:250, still more preferably in a range of 100:65 to 100:245. When the mass ratio (resin:first fluorescent material) of the resin to the first fluorescent material in the second wavelength converting layer falls within the aforementioned range, and when using by laminating the third wavelength converting layer, a desired color tone can be obtained, and a second wavelength converting layer having a desired thickness can be produced.

The mass ratio of the resin to the second fluorescent material in the third wavelength converting layer is not particularly limited as long as a desired color tone can be obtained by the wavelength converting member and an effect of improving the production yield can be obtained. The mass ratio (resin:second fluorescent material) of the resin to the second fluorescent material in the third wavelength converting layer is preferably in a range of 100:50 to 100:150, more preferably in a range of 100:55 to 100:145, even more preferably in a range of 100:60 to 100:140, still more preferably in a range of 100:65 to 100:135. When the mass ratio (resin:second fluorescent material) of the resin to the second fluorescent material in the third wavelength converting layer falls within the aforementioned range, and when using by laminating the second wavelength converting layer, a desired color tone can be obtained, and a third wavelength converting layer having a desired thickness can be produced.

The second wavelength converting layer containing the resin and the first fluorescent material and the third wavelength converting layer containing the resin and the second fluorescent material may be individually produced in a sheet shape, and the second wavelength converting layer and the third wavelength converting layer may be bonded together to produce one wavelength converting member.

The first wavelength converting layer, the second wavelength converting layer, and the third wavelength converting layer have translucency to the light emitted from the light emitting element and the light that is wavelength-converted by the first fluorescent material and the second fluorescent material. Hereinafter, the first wavelength converting layer containing the first fluorescent material and the second fluorescent material, the second wavelength converting layer containing the first fluorescent material, and the third wavelength converting layer containing the second fluorescent material may be referred to as just "wavelength converting layer". Here, the "translucency" means a state where the light transmittance in the light emission peak wavelength of the light emitting element is preferably 60% or more, more preferably 70% or more, even more preferably 80% or more.

Translucent Layer

Figure 3:
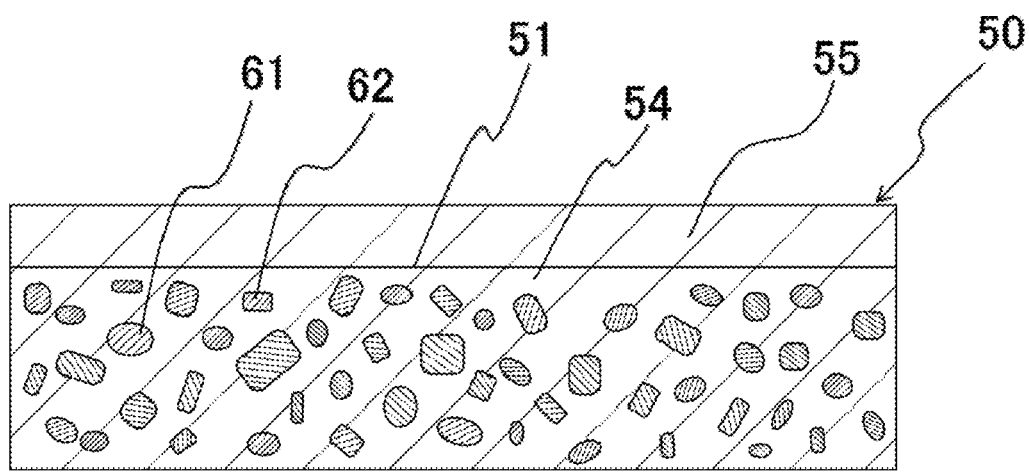
FIG. 3 is a schematic cross-sectional view showing one example of a wavelength converting member according to the present disclosure containing a first wavelength converting layer and a translucent layer.

The wavelength converting member preferably comprises a translucent layer containing no fluorescent material. The translucent layer is preferably arranged at a position closer to the external environment than the wavelength converting layer. FIG. 3 is a diagram showing a schematic cross-section of the wavelength converting member 50 in which the translucent layer 55 is arranged at a position closer to the external environment than the first wavelength converting layer 51. When the wavelength converting member 50 comprises the translucent layer 55 containing no fluorescent material at a position closer to the external environment than the first wavelength converting layer 51, the first fluorescent material 61 and the second fluorescent material 62 each contained in the first wavelength converting member 51 are protected from the external environments such as temperature and humidity, and thus deterioration of the fluorescent material can be suppressed. Examples of the resin constituting the translucent layer may include a resin similar to the resin contained in the first wavelength converting layer, the second wavelength converting layer, or the third wavelength converting layer (hereinafter also referred to as "wavelength converting layer"). The resin constituting the translucent layer may be the same kind as the resin constituting the wavelength converting layer, or may be a different kind therefrom. When the resin constituting the translucent layer is the same kind as the resin constituting the wavelength converting layer, the translucent layer and the wavelength converting layer can be bonded together while improving the adhesiveness between the layers. When the resin constituting the translucent layer is a different kind from the resin constituting the wavelength converting layer, a wavelength converting member formed by adjusting a refractive index of the emitted light can be obtained.

The translucent layer can be produced in a sheet shape in addition to the wavelength converting layer. As for the wavelength converting member, the wavelength converting layer and the translucent layer, which are individually produced in a sheet shape, may be bonded together to produce one wavelength converting member. Further, as for the translucent layer, the first fluorescent material and/or the second fluorescent material added to the liquid resin is previously precipitated at the time of forming a wavelength converting layer, and a translucent layer containing no first fluorescent material and second fluorescent material may be formed at a side opposite to the side where the first fluorescent material and/or the second fluorescent material is precipitated in a thickness direction.

Figure 4:
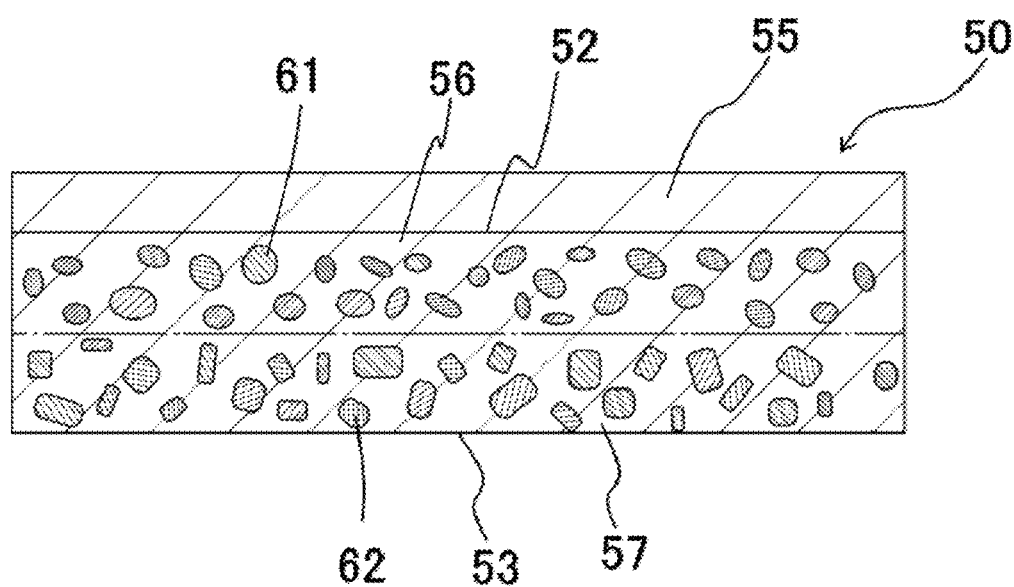
FIG. 4 is a schematic cross-sectional view showing one example of a wavelength converting member according to the present disclosure containing a second wavelength converting layer, a third wavelength converting layer, and a translucent layer.

FIG. 4 is a diagram showing a schematic cross-section of the wavelength converting member 50 in which the third wavelength converting layer 53, the second wavelength converting layer 52, and the translucent layer 55 are laminated in this order. When the second wavelength converting layer contains a $Mn^{4+}$-activated fluoride fluorescent material, as shown in FIG. 4, the second wavelength converting layer 52 is preferably arranged between the translucent layer 55 and the third wavelength converting layer 53 in the wavelength converting member 50. When the $Mn^{4+}$-activated fluoride fluorescent material is used as a first fluorescent material, the fluoride fluorescent material is easily deteriorated due to an influence of moisture or heat. As shown in FIG. 4, when the second wavelength converting layer 52 containing a fluoride fluorescent material is arranged between the translucent layer 55 and the third wavelength converting layer 53, the fluoride fluorescent material that is the first fluorescent material 61 contained in the second wavelength converting layer 52 is protected from the external environments such as humidity and temperature by the translucent layer 55, and also protected from the heat generated from the light emitting element by the third wavelength converting layer 53.

The thickness of the translucent layer is not particularly limited. The thickness of the translucent layer is preferably in a range of 5 μm or more and 100 μm or less, more preferably in a range of 5 μm or more and 90 μm or less, even more preferably in a range of 5 μm or more and 80 μm or less, still more preferably in a range of 5 μm or more and 70 μm or less. When the thickness of the translucent layer falls within a range of 5 μm or more and 100 μm or less, and when using for a light emitting device, demands for thinning the light emitting device can be satisfied, and the fluorescent material can be sufficiently protected from the external environments such as humidity and temperature.

Filler

At least one of the first wavelength converting layer, the second wavelength converting layer, the third wavelength converting layer, and the translucent layer preferably contains a filler. The filler is preferably at least one selected from the group consisting of silicon oxide, zirconium oxide, titanium oxide, zinc oxide, and aluminum oxide. By containing the filler in the wavelength converting layer and/or the translucent layer, scattering of the light emitted from the light emitting element or the light that is wavelength-converted by the fluorescent material is increased, so that a desired color tone can be easily obtained. For example, by using a nanoparticle as the filler, scattering including Rayleigh scattering of the light emitted from the light emitting element is increased, so that the amount of used fluorescent material can be also reduced. The nanoparticle refers to a particle having a volume average particle diameter in a range of 1 nm or more and 100 nm or less. The volume average particle diameter of the nanoparticle refers to a volume particle diameter (median diameter: Dm) where the volume cumulative frequency from the small diameter side reaches 50% in the volume-based particle size distribution, as measured according to the laser diffraction scattering particle size distribution measuring method.

The amount of the filler contained in the wavelength converting layer and/or the translucent layer is not particularly limited as long as the light-scattering effect can be improved without hindering the effect of the present invention. The mass ratio (resin:filler) of the resin to the filler contained in the wavelength converting layer and/or the translucent layer is, from the viewpoint of improving the light-scattering effect, preferably in a range of 100:0.1 to 100:40, more preferably in a range of 100:0.1 to 100:30, even more preferably in a range of 100:0.1 to 100:20, still more preferably in a range of 100:0.1 to 100:10.

Light Emitting Device

Figure 5:
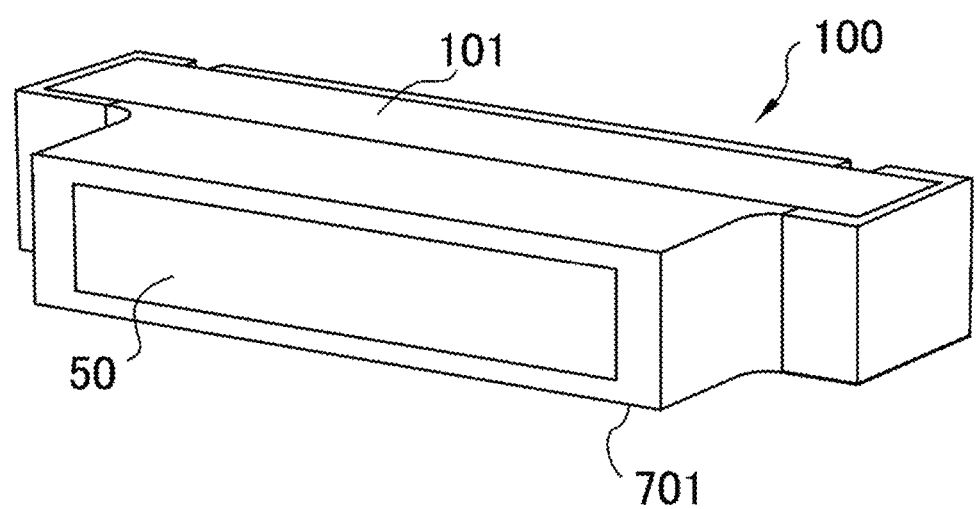
FIG. 5 is a schematic perspective view showing one example of a light emitting device according to the present disclosure.
Figure 6:
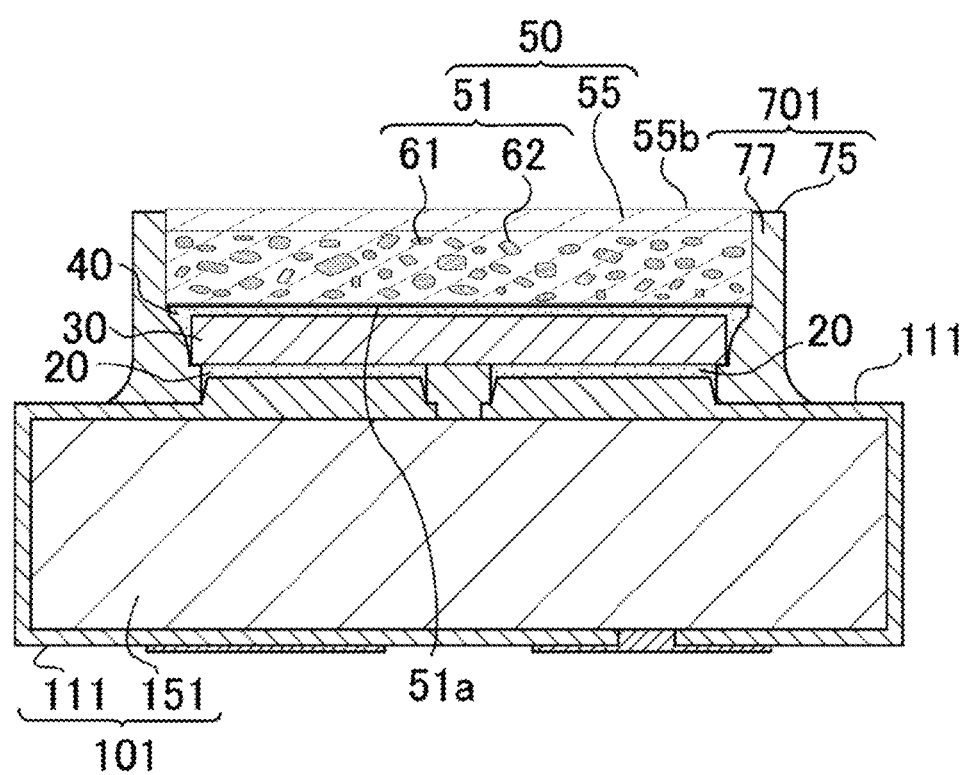
FIG. 6 is a schematic cross-sectional view showing one example of a light emitting device according to the present disclosure.

The light emitting device comprises the wavelength converting member and a light emitting element having a light emission peak wavelength in a range of 400 nm or more and 480 nm or less. FIG. 5 is a schematic perspective view of a light emitting device 100. FIG. 6 is a schematic cross-sectional view of the light emitting device 100.

The light emitting device 100 as shown in FIG. 5 is a side surface emission-type (also referred to as "side view-type") and can be also used as a top surface emission-type (also referred to as "top view-type"). In the side surface emission-type light emitting device, the mounting direction and the main light emission direction are perpendicular to each other. In the top surface emission-type light emitting device, the mounting direction and the main light emission direction are parallel to each other. The front view shape of the light emitting device, that is, the shape viewed from the main light emission direction can be appropriately selected, and is preferably a rectangular shape from the viewpoint of mass productivity. When the light emitting device is a side surface emission-type, the front view shape is preferably a rectangular shape having long and short side directions. When the light emitting device is a top surface emission-type, the front view shape is preferably a square shape. Also, the light emitting element and the wavelength converting member preferably have a front view shape similar to that of the light emitting device. The light emitting device may be a chip size package (CSP) type containing no wiring board and instead, having positive and negative electrodes of the light emitting element or bump electrodes connected to the positive and negative electrodes as terminals for external connection.

As shown in FIG. 5 and FIG. 6, the light emitting device 100 comprises a chip substrate 101, a conductive adhesive member 20, a light emitting element 30, a light guide member 40, a wavelength converting member 50, and a light reflective covering member 701. The chip substrate 101 has a wiring 111 and a base body 151 that holds the wiring 111. The light emitting element 30 is flip-chip mounted on the wiring 111 of the chip substrate via the conductive adhesive member 20. The wavelength converting member 50 contains: a first wavelength converting layer 51 containing a first fluorescent material 61, a second fluorescent material 62, and a resin; and a translucent layer 55 containing no fluorescent material. The wavelength converting member 50 has a size enough to entirely cover the light emitting element 30 in the front view. The wavelength converting member 50 is bonded to the light emitting element 30 via the light guide member 40. The covering member 701 is formed by containing a white pigment 77 in a resin 75. The covering member 701 is formed on the chip substrate 101, and covers side surfaces of each of the light emitting element 30, the light guide member 40, and the wavelength converting member 50. The covering member 701 surrounds whole side circumference of the light emitting element 30 and the wavelength converting member 50. The front surface of the wavelength converting member 50 and the front surface of the covering member 701 constitute substantially the same surface. The wavelength converting member 50 has a first main surface 51a that is one surface of the first wavelength converting layer 51 and a second main surface 55b that is one surface of the translucent layer 55 on a side opposite to the first main surface. The first main surface 51a of the wavelength converting member 50 is bonded to one surface of the light emitting element 30 via the light guide member 40.

Figure 7:
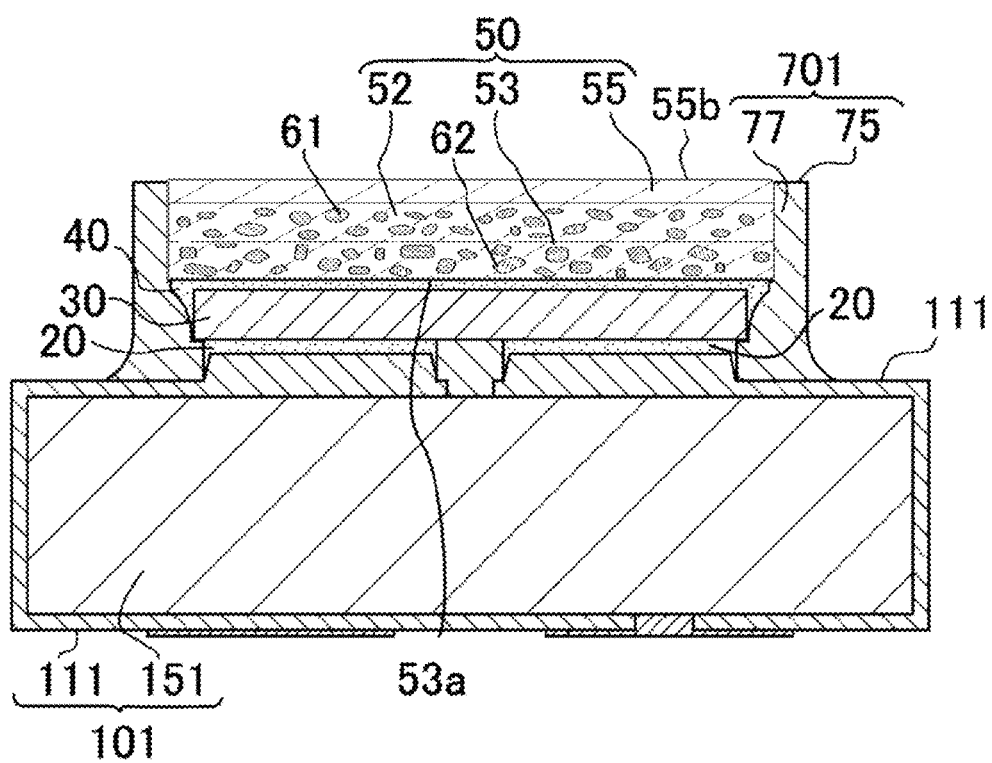
FIG. 7 is a schematic cross-sectional view showing another example of a light emitting device according to the present disclosure.

FIG. 7 shows another example of the light emitting device. The wavelength converting member 50 contains a second wavelength converting layer 52 containing a first fluorescent material 61, a third wavelength converting layer 53 containing a second fluorescent material 62, and a translucent layer 55. The other members than the wavelength converting member 50 of the light emitting device 100 are the same as those of the light emitting device 100 shown in FIG. 6. The wavelength converting member 50 has a first main surface 53a that is one surface of the third wavelength converting layer 53 and a second main surface 55b that is one surface of the translucent layer 55 on a side opposite to the first main surface. The first main surface 53a that is one surface of the third wavelength converting layer 53 of the wavelength converting member 50 is bonded to one surface of the light emitting element 30 via the light guide member 40. In the wavelength converting member 50, the second wavelength converting layer 52 is arranged between the third wavelength converting layer 53 and the translucent layer 55. When the second wavelength converting layer 52 contains a $Mn^{4+}$-activated fluoride fluorescent material as the first fluorescent material 61, the fluoride fluorescent material that is the first fluorescent material 61 contained in the second wavelength converting layer 52 is protected from the external environments such as humidity and temperature by the translucent layer 55, and also protected from the heat generated from the light emitting element by the third wavelength converting layer 53.

Light Emitting Element

The light emitting element comprises at least a semiconductor element structure, and further comprises a substrate in most cases. Examples of the light emitting element may include an LED chip. The front view shape of the light emitting element is preferably a rectangular shape and particularly a square shape or a long rectangular shape in one direction, and may also be other shapes. Even when the shape is, for example, a hexagonal shape, the light emission efficiency can also be enhanced. The side surfaces of the light emitting element or the substrate may be vertical to the top surface, or may be inclined inwardly or outwardly. The light emitting element preferably has positive and negative (p, n) electrodes on the same surface. The number of the light emitting element to be mounted on one light emitting device may be one, or may be a plural number. A plurality of light emitting elements can be electrically connected in series or in parallel. It is preferable that the semiconductor element structure contains a laminate of semiconductor layers, that is, at least an n-type semiconductor layer and a p-type semiconductor layer, and an active layer is interposed therebetween. The semiconductor element structure may contain positive and negative electrodes and/or an insulating film. The positive and negative electrodes can be constituted of gold, silver, tin, platinum, rhodium, titanium, aluminum, tungsten, palladium, nickel, or an alloy of any of these. The insulating film can be constituted of an oxide or a nitride of at least one element selected from the group consisting of silicon, titanium, zirconium, niobium, tantalum, and aluminum.

In the light emitting element, the light emission peak wavelength of the light emitting element can be adjusted within a range of ultraviolet region to infrared region depending on the semiconductor material or the mixed crystal ratio. As for the semiconductor material, it is preferable to use a nitride semiconductor capable of emitting short-wavelength light that can efficiently excite a fluorescent material. The nitride semiconductor can be mainly represented by a general formula: $In_xAl_yGa_{1-x-y}N$ (where $x \geq 0$, $y \geq 0$, and $x+y \leq 1$). From the viewpoints of the light emission efficiency as well as the mixed color relation between the excitation of fluorescent material and the light emission, and the like, the light emission peak wavelength of the light emitting element is in a range of 400 nm or more and 530 nm or less, and preferably in a range of 400 nm or more and 500 nm or less, more preferably in a range of 400 nm or more and 480 nm or less, even more preferably in a range of 420 nm or more and 475 nm or less. In addition, an InAlGaAs-based semiconductor, an InAlGaP-based semiconductor, zinc sulfide, zinc selenide, silicon carbide can be also used. The substrate of the light emitting element is a substrate for crystal growth capable of growing a crystal of the semiconductor mainly constituting the semiconductor element structure, and may be a substrate for bonding capable of bonding to the semiconductor element structure that is separated from the substrate for crystal growth. When the substrate has translucency, a flip-chip mounting can be easily employed, and the light extraction efficiency can be easily enhanced. Examples of the matrix of the substrate may include sapphire, spinel, gallium nitride, aluminum nitride, silicon, silicon carbide, gallium arsenide, gallium phosphide, indium phosphide, zinc sulfide, zinc oxide, zinc selenide, diamond, and the like. Among others, sapphire is preferred. The thickness of the substrate is, for example, in a range of 0.02 mm or more and 1 mm or less, and preferably in a range of 0.05 mm or more and 0.3 mm or less from the viewpoints of the strength of the substrate and the thickness of the light emitting device.

Chip Substrate

The substrate is constituted of at least a wiring and a base body that holds the wiring. In addition, the substrate may contain an insulating protective film such as a solder resist or a cover lay. The same applies to the chip substrate 101.

Wiring

The wiring 111 may be formed on at least the top surface (front surface) of the base body, or may be also formed on the inside, the side surface, and/or the bottom surface (back surface) of the base body. Also, the wiring preferably has an element connection terminal part where the light emitting element is mounted, an external connection terminal part to be connected to an external circuit, a lead wiring part that connects these terminal parts. The wiring can be constituted of copper, iron, nickel, tungsten, chromium, aluminum, silver, gold, titanium, palladium, rhodium, or an alloy of any of these. The wiring may be a single-layer or a multi-layer of metals or alloys. In particular, copper or a copper alloy is preferred from the viewpoint of the heat dissipation. Further, a layer formed of silver, platinum, aluminum, rhodium, gold, or an alloy of any of these may be provided on the surface layer of the wiring from the viewpoint of the wettability of the bonding member and/or the light reflectivity.

Base Body

When the substrate is a rigid substrate, the base body 151 can be constituted by using a resin or a fiber-reinforced resin, ceramics, glass, metal, paper, and the like. Examples of the resin or the fiber-reinforced resin may include epoxy, glass epoxy, bismaleimide triazine (BT), polyimide. Examples of the ceramics may include aluminum oxide, aluminum nitride, zirconium oxide, zirconium nitride, titanium oxide, titanium nitride, a mixture of any of these, and the like. Examples of the metal may include copper, iron, nickel, chromium, aluminum, silver, gold, titanium, an alloy of any of these. When the substrate is a flexible substrate, the base body can be constituted by using polyimide, polyethylene terephthalate, polyethylene naphthalate, liquid crystal polymer, cycloolefin polymer. Among these substrates, it is especially preferable to use a substrate having a physical property close to the coefficient of linear expansion of the light emitting element.

Conductive Adhesive Member

As for the conductive adhesive member 20, at least one of: a bump such as a gold bump, a silver bump, or a copper bump; a metal paste containing metal powder such as silver powder, gold powder, copper powder, platinum powder, aluminum powder, or palladium powder and a resin binder; solder such as tin-bismuth-based solder, tin-copper-based solder, tin-silver-based solder, or gold-tin-based solder; and brazing filler metal such as low melting point metal; can be used.

Light Guide Member

The light guide member is a member 40 of bonding the light emitting element to the wavelength converting member, and guiding the light emitted from the light emitting element to the wavelength converting member. Examples of the matrix of the light guide member may include a silicone resin, an epoxy resin, a phenol resin, a polycarbonate resin, an acrylic resin, and a modified resin of any of these. Among others, a silicone resin and a modified silicone resin are preferred since the heat resistance and the light resistance are excellent. Specific examples of the silicone resin may include a dimethyl silicone resin, a phenylmethyl silicone resin, and a diphenyl silicone resin. Further, the resin constituting the light guide member may contain a filler similar to that of the wavelength converting member.

Light Reflective Covering Member

In the light reflective covering member 701, the light reflectance at the light emission peak wavelength of the light emitting element is preferably 70% or more, more preferably 80% or more, even more preferably 90% or more, from the viewpoint of the forward light extraction efficiency. The color of the covering member is preferably white. Thus, the covering member is preferably formed by containing white pigment in the resin. The covering member is once being a liquid state before the curing. The covering member can be formed by transfer molding, injection molding, compression molding, potting.

Resin of Covering Member

Examples of the resin 75 of the covering member may include a silicone resin, an epoxy resin, a phenol resin, a polycarbonate resin, an acrylic resin, and a modified resin of any of these. Among others, a silicone resin and a modified silicone resin are preferred since the heat resistance and the light resistance are excellent. Specific examples of the silicone resin may include a dimethyl silicone resin, a phenylmethyl silicone resin, and a diphenyl silicone resin. Further, the resin constituting the covering member may contain a filler similar to that of the wavelength converting member.

White Pigment

As for the white pigment 77, one kind of titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, and zirconium oxide can be used alone, or two or more kinds thereof can be used in combination. The shape of the white pigment is not particularly limited. The shape may be an undefined shape or a crushed shape, and is preferably a spherical shape from the viewpoint of the fluidity. The particle diameter of the white pigment may be, for example, in a range of 0.1 μm or more and 0.5 μm or less, but in order to enhance the effects of light reflecting and covering, a smaller particle diameter is more preferred. The content of the white pigment in the light reflective covering member can be appropriately selected, but from the viewpoints of the light reflectivity, the viscosity in a liquid state, and the like, the content is preferably in a range of 10% by mass or more and 80% by mass or less, more preferably in a range of 20% by mass or more and 70% by mass or less, even more preferably in a range of 30% by mass or more and 60% by mass or less, still more preferably in a range of 50% by mass or more and 65% by mass or less, relative to the total amount that is 100% by mass of the covering member.

Method for Producing Light Emitting Device

The method for producing a light emitting device contains a first step of subjecting a light emitting element 30 on a substrate 101 to a flip-chip mounting, a second step of bonding a first main surface of a wavelength converting member 50 onto the light emitting element 30 via a light guide member 40, a third step of cutting the side surfaces of the wavelength converting member 50, a fourth step of covering the side surfaces of the light emitting element 30 and the wavelength converting member 50 with a light reflective covering member 701 to thereby form the covering member 701 on the substrate 101, and a fifth step of cutting the substrate 101 and the covering member 701 to thereby form an individual light emitting device 100. Specifically, a light emitting device can be produced according to the method described in Japanese Unexamined Patent Publication No. 2017-188592.

EXAMPLES

The present invention is hereunder specifically described by reference to the following Examples. The present invention is not limited to these Examples.

Production of Wavelength Converting Member

Example 1

A β-SiAlON fluorescent material having a circularity of 0.715 was used as a second fluorescent material. A $Mn^{4+}$-activated potassium fluorosilicate fluorescent material was used as a first fluorescent material. A phenylmethyl silicone resin was used as a resin. A silicon oxide nanoparticle having a particle diameter in a range of 10 nm or more and 500 nm or less was used as a filler. 27 parts by mass of the β-SiAlON fluorescent material, 63 parts by mass of the $Mn^{4+}$-activated potassium fluorosilicate fluorescent material (the total amount of the first fluorescent material and the second fluorescent material was 90 parts by mass), and 0.4 parts by mass of the silicon oxide nanoparticle were mixed to 100 parts by mass of the resin, and the resin was cured to thereby form a sheet-shaped first wavelength converting layer. The thickness of the first wavelength converting layer was 145 μm. A phenylmethyl silicone was used as a resin to form a translucent layer having a thickness of 40 μm. The first wavelength converting layer and the translucent layer were bonded using an epoxy resin as a light guide member, thereby producing a rectangular-shaped chip wavelength converting member having a size of 185 μm thickness, 1.21 mm width (crosswise), and 0.16 mm depth.

Examples 2 to 4

A wavelength converting member was produced by the same method as in Example 1 except that a β-SiAlON fluorescent material having a circularity of each of Examples 2 to 4 described in Table 1 was used as a second fluorescent material.

Comparative Example 1

A wavelength converting member was produced by the same method as in Example 1 except that a β-SiAlON fluorescent material having a circularity of 0.674 was used as a second fluorescent material.

Light Emitting Device

A light emitting device 100 similar to the one shown in FIG. 5 or FIG. 6 was produced by using the wavelength converting member of each of Examples and Comparative Example 1. Specifically, a side surface emission-type light emitting device having a size of 1.8 mm width (crosswise), 0.32 mm thickness (lengthwise), and 0.70 mm depth was produced.

The chip substrate 101 had a size of 1.8 mm width (crosswise), 0.32 mm thickness (lengthwise), and 0.36 mm depth. The base body 151 was a rectangular-shaped chip made of a BT resin (for example, HL832NSF type LCA, manufactured by Mitsubishi Gas Chemical Company, Inc.). A pair of positive and negative wirings 111 was formed by laminating copper, nickel, and gold from the base body 151 side. The pair of positive and negative wirings 111 contained an element connection terminal part that was formed at a center area in the lateral direction on the front surface of the base body 151, a lead wiring part, and external connection terminal parts that were formed from the left and right terminal parts on the front surface of the base body 151 to the left and right terminal parts on the back surface via the side surfaces, and were exposed from the left and right of the covering member 701 to be described below. Here, the element connection terminal part contained a copper-layered bump having a depth of 0.04 mm. One light emitting element 30 was flip-chip mounted on the element connection terminal part of the pair of positive and negative wirings 111 via the conductive adhesive member 20. The light emitting element 30 was a rectangular-shaped LED chip having a size of 1.1 mm width (crosswise), 0.2 mm thickness (lengthwise), and 0.12 mm depth, capable of emitting blue light (light emission peak wavelength of 452 nm), in which an n-type nitride semiconductor layer, an active layer, and a p-type nitride semiconductor layer were sequentially laminated on a sapphire substrate. The conductive adhesive member 20 was a gold-tin-based solder (Au:Sn=79:21) having a depth of 0.015 mm. The wavelength converting member 50 of each of Examples and Comparative Example was bonded on the light emitting element 30 via the light guide member 40. The wavelength converting member 50 had a first main surface 51a that was one surface of the first wavelength converting layer 51 and a second main surface 55b that was one surface of the translucent layer 55 on a side opposite to the first main surface, and the first main surface 51a that was one surface of the first wavelength converting layer 51 was bonded to the light emitting element 30 via the light guide member 40. The light guide member 40 was a cured product made of a dimethyl silicone resin having a depth of 0.005 mm. The light reflective covering member 701 was formed on the front surface of the chip substrate 101 so as to surround whole side circumference of the light emitting element 30 and the wavelength converting member 50. The covering member 701 had a size of 1.35 mm width (crosswise) and 0.32 mm thickness (lengthwise), and was formed by containing 60% by mass of titanium oxide as the white pigment 77 in the resin 75 that was a cured product made of a phenylmethyl silicone resin. The covering member 701 directly covered the side surfaces of the light emitting element 30, the side surfaces of the light guide member 40, and the side surfaces of the wavelength converting member 50. The front surface of the covering member 701 was formed to constitute substantially the same surface as the front surface of the wavelength converting member 50.

Average Particle Diameter According to FSSS Method

The average particle diameter D2 of the β-SiAlON fluorescent material used in each of Examples and Comparative Example; and the average particle diameter D1 of the $Mn^{4+}$-activated fluoride fluorescent material as a first fluorescent material used in each of Examples and Comparative Example were measured according to the FSSS method. Specifically, using a Fisher Sub-Sieve Sizer Model 95 (manufactured by Fisher Scientific Inc.), each of the β-SiAlON fluorescent materials and the $Mn^{4+}$-activated fluoride fluorescent materials was sampled in an amount of 1 $cm^3$ under an environment at a temperature of 25° C. and a humidity of 70% RH, and packed in a dedicated tubular container. Then, a dry air flow was introduced therein under a constant pressure to read a specific surface area of the sample from the differential pressure, and thus the average particle diameter according to the FSSS method was calculated. The results are shown in Table 1.

Volume Average Particle Diameter Dm2 According to Laser Diffraction Scattering Particle Size Distribution Measuring Method As for the β-SiAlON fluorescent material used in each of Examples and Comparative Example, using a laser diffraction scattering particle size distribution measuring apparatus (Mastersizer 3000, manufactured by Malvern Instruments Ltd.), the volume average particle diameter (median diameter) Dm2 where the volume cumulative frequency from the small diameter side reached 50% was measured. The results are shown in Table 1. As for the β-SiAlON fluorescent material used in each of Examples and Comparative Example, the particle diameter ratio D2/Dm2 of the average particle diameter D2, as determined according to the FSSS method, to the volume average particle diameter Dm2 was calculated. The results are shown in Table 1.

SEM Micrograph

Figure 8:
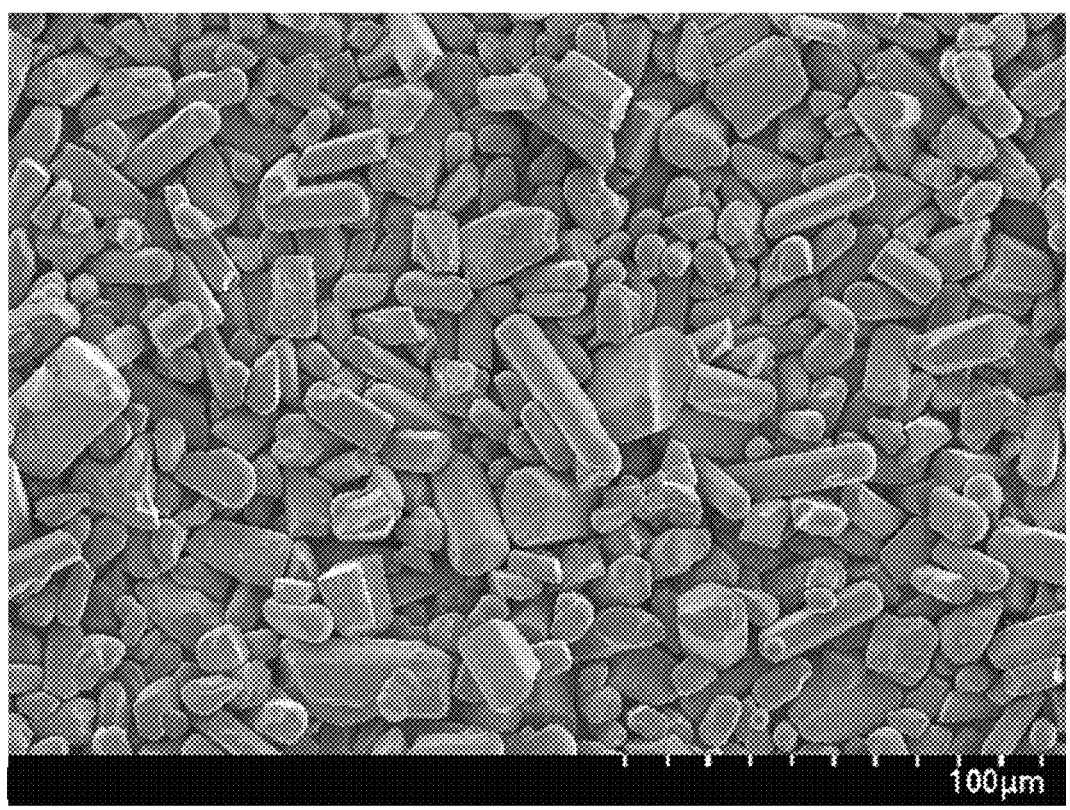
FIG. 8 is a scanning electron microscope (SEM) micrograph showing a β-SiAlON fluorescent material contained in a wavelength converting member according to Example 1.
Figure 9:
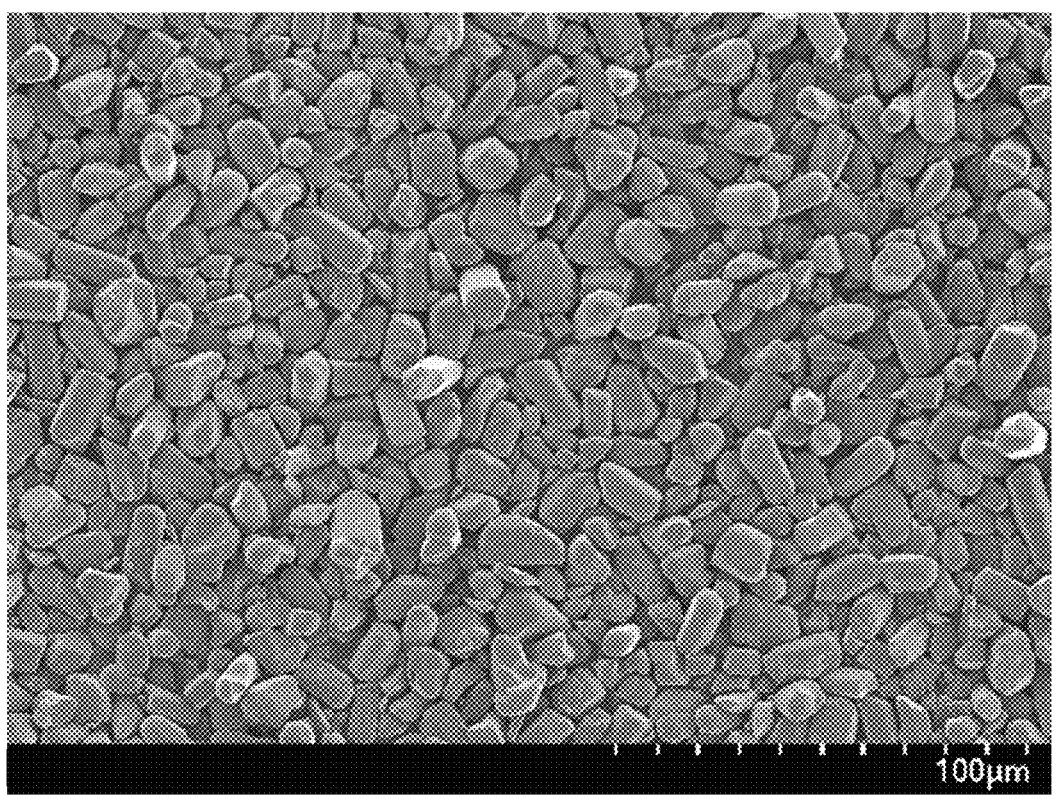
FIG. 9 is a SEM micrograph showing a β-SiAlON fluorescent material contained in a wavelength converting member according to Example 3.
Figure 10:
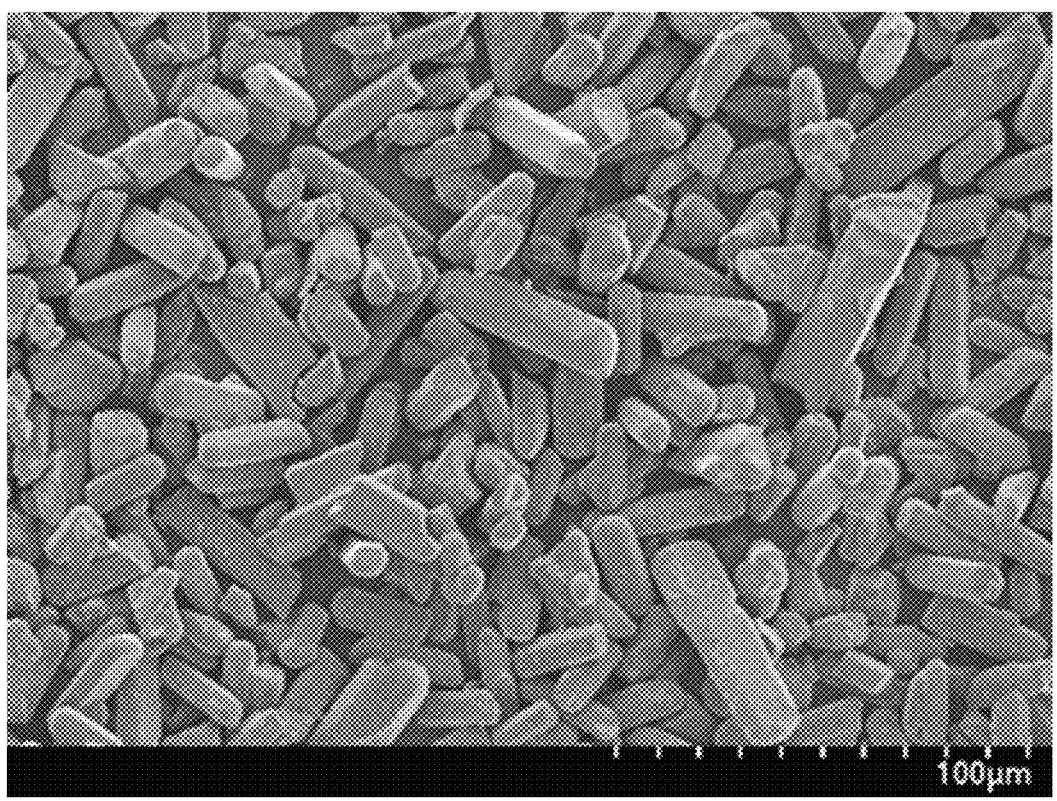
FIG. 10 is a SEM micrograph showing a β-SiAlON fluorescent material contained in a wavelength converting member according to Comparative Example 1.

Using a scanning electron microscope (SEM), SEM micrographs of the β-SiAlON fluorescent materials used in Examples and Comparative Example were obtained. FIG. 8 shows an SEM micrograph of the β-SiAlON fluorescent material used in Example 1, FIG. 9 shows an SEM micrograph of the β-SiAlON fluorescent material used in Example 3, and FIG. 10 shows an SEM micrograph of the β-SiAlON fluorescent material used in Comparative Example 1.

Circularity

The circularity of the β-SiAlON fluorescent material used in each of Examples and Comparative Example was determined by: randomly selecting 5,000 particles from the photographed image by the observation using an optical microscope; measuring a projected area (S ($m^2$)) and a peripheral length (L (m)) of each of the selected particles using an image processing software (Morphologi G3S, manufactured by Malvern Instruments Ltd.); calculating a circularity of each of the particles according to the following formula (1); and averaging the calculated circularities.

$$\text{Circularity} = 4\pi S/L^2 \qquad (1)$$

Aspect Ratio

The aspect ratio of the β-SiAlON fluorescent material used in each of Examples and Comparative Example was determined by: randomly selecting 5,000 particles from the photographed image by the observation using an optical microscope; measuring a long diameter and a short diameter of each of the selected particles using an image processing software (Morphologi G3S, manufactured by Malvern Instruments Ltd.); calculating a ratio (short diameter/long diameter) of the short diameter to the long diameter as the aspect ratio of each of the particles; and averaging the calculated ratios.

Standard Deviation xσ, yσ of Chromaticity (x, y)

With respect to a plurality of the light emitting devices of each of Examples and Comparative Example, the chromaticity x, y was measured using an optical measurement system combining a multichannel spectrometer and an integrating sphere. The chromaticities x, y of the lights emitted from a plurality of the light emitting devices and the standard deviations xσ, yσ of the chromaticities x, y were determined for each Example and Comparative Example. Specifically, the chromaticities x, y of 3,700 light emitting devices were measured for each Example and Comparative Example, and the standard deviations xσ of the chromaticities x and the standard deviations yσ of the chromaticities y were determined. It indicates that the smaller the values of the standard deviation xσ of the chromaticity x and the standard deviation yσ of the chromaticity y in the light emitting device of each of Examples and Comparative Example can be suppressed the color tone variation among the light emitting devices, and thus a more desired color tone can be changed. The results are shown in Table 1.

device of Comparative Example 1. From these results, it could be considered that the fluorescent material was uniformly dispersed in the resin to be uniformly arranged in the wavelength converting member, the light emitted from the light emitting element entered from a substantially uniform surface direction with respect to the β-SiAlON fluorescent material, and the change in chromaticity caused by entering the excitation light from various surface directions was suppressed, so that a desired color tone could be obtained. The β-SiAlON fluorescent material contained in the wavelength converting member of the light emitting device in each of Example 4 had the circularity of 0.8 or more, and β-SiAlON fluorescent material had a shape closer to a circle. Therefore. The light emitting device of Example 4 has the smaller standard deviation yσ than the light emitting devices of Examples 1 to 3. Further, the fluorescent material contained in the wavelength converting member of the light emitting device in each of Examples 1 to 4 was uniformly dispersed in the resin to be uniformly arranged in the wavelength converting member. Thereby, inconvenient behaviors, which occurred at the time of cutting the sheet-

TABLE 1

| | First Fluorescent Material $Mn^{4+}$-activated Fluoride Fluorescent Material | Second Fluorescent Material β-SiAlON Fluorescent Material | | | | | Light Emitting Device Standard Deviation xσ, yσ of Chromaticity (x, y) | |
|---|---|---|---|---|---|---|---|---|
| | Average Particle Diameter D1 According to FSSS Method | | Aspect | Average Particle Diameter D2 According to FSSS Method | Volume Average Particle Diameter Dm2 | Particle Diameter Ratio | | |
| | (μm) | Circularity | Ratio | (μm) | (μm) | D2/Dm2 | xσ | yσ |
| Comparative Example 1 | 9.0 | 0.674 | 0.619 | 13.0 | 19.5 | 0.667 | 0.0011 | 0.0045 |
| Example 1 | 9.0 | 0.715 | 0.705 | 12.4 | 15.8 | 0.785 | 0.0011 | 0.0044 |
| Example 2 | 9.0 | 0.752 | 0.688 | 9.7 | 12.6 | 0.770 | 0.0012 | 0.0040 |
| Example 3 | 9.0 | 0.744 | 0.718 | 9.9 | 12.2 | 0.811 | 0.0010 | 0.0036 |
| Example 4 | 9.0 | 0.811 | 0.721 | 9.6 | 12.1 | 0.793 | 0.0009 | 0.0030 |

As for the β-SiAlON fluorescent material contained in the wavelength converting member of the light emitting device in each of Examples 1 to 4, the circularity was 0.7 or more, and the volume average particle diameter was in a range of 12.1 μm or more and 15.8 μm or less. The color tone variation of the β-SiAlON fluorescent material contained in the wavelength converting member of the light emitting device in each of Examples 1 to 4 was suppressed as compared with that of the β-SiAlON fluorescent material contained in the wavelength converting member of the light emitting device in Comparative Example 1, and thus the production yield could be improved as compared with the light emitting device of Comparative Example 1. The circularity of the β-SiAlON fluorescent material contained in the wavelength converting member of the light emitting device in each of Examples 1 to 4 was 0.7 or more, that is, the nearly circular β-SiAlON fluorescent material was contained therein. The standard deviation yσ of the chromaticity y, which depended on the color tone of the β-SiAlON fluorescent material, in the light emitting device of each of Examples 1 to 4 was smaller than that in the light emitting shaped wavelength converting member, such as sticking out of the fluorescent material to the outside from the end surface of the cut wavelength converting member and strain generated on the wavelength converting member, could be avoided.

The wavelength converting member according to one embodiment of the description and the light emitting device using the same can be utilized for backlight sources of liquid crystal displays, various kinds of lighting fixtures, various kinds of display devices such as advertisements and destination guides, projector devices, and the like.

The invention claimed is:

1. A light emitting device, comprising a sheet-shaped wavelength converting member and a light emitting element having a light emission peak wavelength in a range of 400 nm or more and 480 nm or less,
   wherein the sheet-shaped wavelength converting member comprising a first wavelength converting layer containing:
   a first fluorescent material having a light emission peak wavelength in a range of 620 nm or more and 660 nm or less;

a second fluorescent material having a light emission peak wavelength in a range of 510 nm or more and 560 nm or less; and a resin, wherein an average particle diameter, as measured according to a Fisher Sub-Sieve Sizer method, of the first fluorescent material is in a range of 2 μm or more and 30 μm or less, wherein the second fluorescent material comprises a β-SiAlON fluorescent material, a circularity of the β-SiAlON fluorescent material is 0.7 or more, and a volume average particle diameter, as measured according to a laser diffraction scattering particle size distribution measuring method, of the β-SiAlON fluorescent material is in a range of 2 μm or more and 30 μm or less, and a ratio of an average particle diameter of the β-SiAlON fluorescent material, as measured according to the Fisher Sub-Sieve Sizer method, to the volume average particle diameter of the β-SiAlON fluorescent material, as measured according to the laser diffraction scattering particle size distribution measuring method, is 0.67 or more, wherein a thickness of the first wavelength converting layer is in a range of 50 μm or more and 200 μm or less, and wherein the sheet-shaped wavelength converting member has a first main surface that is one surface of the first wavelength converting layer, and a second main surface on a side opposite to the first main surface, and the first main surface is bonded to the light emitting element.

2. A light emitting device, comprising a sheet-shaped wavelength converting member and a light emitting element having a light emission peak wavelength in a range of 400 nm or more and 480 nm or less, wherein the sheet-shaped wavelength converting member comprising:

a second wavelength converting layer containing a first fluorescent material having a light emission peak wavelength in a range of 620 nm or more and 660 nm or less and a first resin; and a third wavelength converting layer containing a second fluorescent material having a light emission peak wavelength in a range of 510 nm or more and 560 nm or less and a second resin, wherein an average particle diameter, as measured according to a Fisher Sub-Sieve Sizer method, of the first fluorescent material is in a range of 2 μm or more and 30 μm or less, wherein the second fluorescent material comprises a β-SiAlON fluorescent material, a circularity of the β-SiAlON fluorescent material is 0.7 or more, and a volume average particle diameter, as measured according to a laser diffraction scattering particle size distribution measuring method, of the β-SiAlON fluorescent material is in a range of 2 μm or more and 30 μm or less, and a ratio of an average particle diameter of the β-SiAlON fluorescent material, as measured according to the Fisher Sub-Sieve Sizer method, to the volume average particle diameter of the β-SiAlON fluorescent material, as measured according to the laser diffraction scattering particle size distribution measuring method, is 0.67 or more, wherein a thickness of each of the second wavelength converting layer and the third wavelength converting layer is in a range of 10 μm or more and 150 μm or less, wherein the sheet-shaped wavelength converting member has a first main surface that is one surface of the third wavelength converting layer and a second main surface on a side opposite to the first main surface, and the first main surface is bonded to the light emitting element, and wherein the second wavelength converting layer and the third wavelength converting layer are bonded together.

3. The light emitting device according to claim 1, wherein an aspect ratio of the β-SiAlON fluorescent material is 0.62 or more.

4. The light emitting device according to claim 2, wherein an aspect ratio of the β-SiAlON fluorescent material is 0.62 or more.

5. The light emitting device according to claim 1, wherein the first fluorescent material comprises:

a $Mn^{4+}$-activated fluoride fluorescent material;

a fluorescent material containing an $Eu^{2+}$-activated silicon nitride containing at least one element selected from Sr and Ca, and Al; and at least one fluorescent material containing an $Eu^{2+}$-activated aluminum nitride containing at least alkaline earth metal element and at least one alkali metal elements, and wherein the second fluorescent material further comprises:

a chlorosilicate-based fluorescent material;

a $Mn^{2+}$-activated aluminate fluorescent material containing at least one alkaline earth metal element selected from the group consisting of Ba, Sr, and Ca; and at least one γ-AlON fluorescent material.

6. The light emitting device according to claim 2, wherein the first fluorescent material comprises:

a $Mn^{2+}$-activated fluoride fluorescent material;

a fluorescent material containing an $Eu^{2+}$-activated silicon nitride containing at least one element selected from Sr and Ca, and Al; and at least one fluorescent material containing an $Eu^{2+}$-activated aluminum nitride containing at least one alkaline earth metal element and at least one alkali metal element, and wherein the second fluorescent material further comprises:

a chlorosilicate-based fluorescent material;

a $Mn^{2+}$-activated aluminate fluorescent material containing at least one element selected from the group consisting of Ba, Sr, and Ca; and at least one γ-AlON fluorescent material.

7. The light emitting device according to claim 1, wherein a mass ratio of the resin contained in the first wavelength converting layer to a total of the first fluorescent material and the second fluorescent material falls within a range of 100:50 to 100:260.

8. The light emitting device according to claim 2, wherein a mass ratio of the first resin contained in the second wavelength converting layer to the first fluorescent material falls within a range of 100:50 to 100:260, and a mass ratio of the second resin contained in the third wavelength converting layer to the second fluorescent material falls within a range of 100:50 to 100:150.

9. The light emitting device according to claim 1, wherein the sheet-shaped wavelength converting member further comprises a translucent layer containing no fluorescent material.

10. The light emitting device according to claim 2, wherein the sheet-shaped wavelength converting member further comprises a translucent layer containing no fluorescent material.

11. The light emitting device according to claim 10, wherein the second wavelength converting layer is located between the translucent layer and the third wavelength converting layer, and wherein the second wavelength converting layer comprises a $Mn^{4+}$-activated fluoride fluorescent material.

12. The light emitting device according to claim 1, wherein the resin is a silicone resin or an epoxy resin.

13. The light emitting device according to claim 2, wherein at least one of the first resin and the second resin is a silicone resin or an epoxy resin.

14. The light emitting device according to claim 9, wherein at least one of the first wavelength converting layer and the translucent layer comprises a filler, wherein the filler is at least one selected from the group consisting of silicon oxide, zirconium oxide, titanium oxide, zinc oxide, and aluminum oxide.

15. The light emitting device according to claim 10, wherein at least one of the second wavelength converting layer, the third wavelength converting layer, and the translucent layer comprises a filler, wherein the filler is at least one selected from the group consisting of silicon oxide, zirconium oxide, titanium oxide, zinc oxide, and aluminum oxide.

* * * * *